(12) United States Patent
Misaki et al.

(10) Patent No.: US 9,528,186 B2
(45) Date of Patent: Dec. 27, 2016

(54) SURFACE-COATING MATERIAL, CUTTING TOOL IN WHICH SAID MATERIAL IS USED, AND WORKING MACHINE IN WHICH SAID MATERIAL IS USED

(71) Applicant: MITSUBISHI HEAVY INDUSTRIES MACHINE TOOL CO., LTD., Ritto-shi, Shiga (JP)

(72) Inventors: Masanobu Misaki, Tokyo (JP); Taiji Kikuchi, Tokyo (JP)

(73) Assignee: MITSUBISHI HEAVY INDUSTRIES MACHINE TOOL CO., LTD., Shiga (JP)

( * ) Notice: Subject to any disclaimer, the term of this patent is extended or adjusted under 35 U.S.C. 154(b) by 0 days.

(21) Appl. No.: 14/439,978

(22) PCT Filed: Jan. 30, 2014

(86) PCT No.: PCT/JP2014/052025
§ 371 (c)(1),
(2) Date: Apr. 30, 2015

(87) PCT Pub. No.: WO2014/123053
PCT Pub. Date: Aug. 14, 2014

(65) Prior Publication Data
US 2015/0299866 A1    Oct. 22, 2015

(30) Foreign Application Priority Data
Feb. 7, 2013   (JP) .................................. 2013-022091

(51) Int. Cl.
*B23B 27/14* (2006.01)
*C23C 28/04* (2006.01)
(Continued)

(52) U.S. Cl.
CPC ........... *C23C 28/044* (2013.01); *B23B 27/148* (2013.01); *C23C 14/0641* (2013.01);
(Continued)

(58) Field of Classification Search
USPC .......... 51/307, 309; 428/216, 336, 457, 698, 428/699, 697
See application file for complete search history.

(56) References Cited

U.S. PATENT DOCUMENTS

| | | | | |
|---|---|---|---|---|
| 7,763,366 B2 * | 7/2010 | Yamamoto | .............. | C23C 14/06 428/699 |
| 2009/0075114 A1 * | 3/2009 | Hovsepian | ............ | C23C 14/022 428/469 |
| 2009/0252973 A1 * | 10/2009 | Cremer | ............... | C23C 14/0641 428/446 |

FOREIGN PATENT DOCUMENTS

| | | |
|---|---|---|
| CN | 1820880 A | 8/2006 |
| JP | 10-25566 A | 1/1996 |

(Continued)

OTHER PUBLICATIONS

Karvankova et al "Thermal stabilty of Cr(1–x)Al(x)Si(y)N coatings with medium to high aluminium content prepared by arc evaportaion" Mater.Res.Soc.Symp.Proc. vol. 890 (2006).*

(Continued)

*Primary Examiner* — Archene Turner
(74) *Attorney, Agent, or Firm* — Birch, Stewart, Kolasch & Birch, LLP

(57) ABSTRACT

The present invention provides a surface-coating material capable of exhibiting high peeling resistance and high chipping resistance. A surface-coating material is provided with a base material, a bottom layer, and a top layer. The base material comprises high-speed tool steel or cemented carbide. The bottom layer is provided on the surface of the base material and comprises at least one nitride of titanium, (Continued)

aluminum, chromium, and zirconium. The top layer is provided on the surface of the bottom layer and is formed by alternatingly laminating an A layer and/or a B layer. The A layer comprises a nitride of aluminum, chromium, and silicon. The B layer comprises a nitride of aluminum, chromium, and yttrium.

8 Claims, 1 Drawing Sheet

(51) Int. Cl.
  *C23C 14/06*  (2006.01)
  *C23C 28/00*  (2006.01)

(52) U.S. Cl.
  CPC ............ *C23C 28/042* (2013.01); *C23C 28/42* (2013.01); *B23B 2228/08* (2013.01); *B23B 2228/105* (2013.01)

(56) References Cited

FOREIGN PATENT DOCUMENTS

| | | |
|---|---|---|
| JP | 2005-330539 A | 12/2005 |
| JP | 3963354 B2 | 8/2007 |
| JP | 2008-284642 A | 11/2008 |
| JP | 2008-7835 A | 1/2009 |
| JP | 2009-95915 A | 5/2009 |
| JP | 2009-101491 A | 5/2009 |
| JP | 2009-285758 A | 12/2009 |
| JP | 2010-1547 A | 1/2010 |
| JP | 2010-137335 A | 6/2010 |
| JP | 2010-137336 | 6/2010 |
| JP | 2010-207916 A | 9/2010 |
| JP | 2011-45970 A | 3/2011 |
| WO | WO 2009/037776 A1 | 3/2009 |
| WO | WO 2010/150411 A1 | 12/2010 |

OTHER PUBLICATIONS

International Preliminary Report on Patentability and Written Opinion of the International Searching Authority (Forms PCT/IB/338,PCT/IB/373 and PCT/ISA/237) for International Application No. PCT/JP2014/052025, dated Aug. 20, 2015.

International Search Report and Written Opinion of the International Searching Authority (Forms PCT/ISA/210, PCT/ISA/220 and PCT/ISA/237) for International Application No. PCT/JP2014/052025, dated Apr. 22, 2014, with an English translation of the International Search Report only.

Chinese Official Action dated Mar. 30, 2016 issued in corresponding Chinese Application No. 201480002862.6 with an English translation.

Japanese Official Action dated Mar. 22, 2016 received in corresponding Jp Application No. 2014-560738 with an English translation.

* cited by examiner

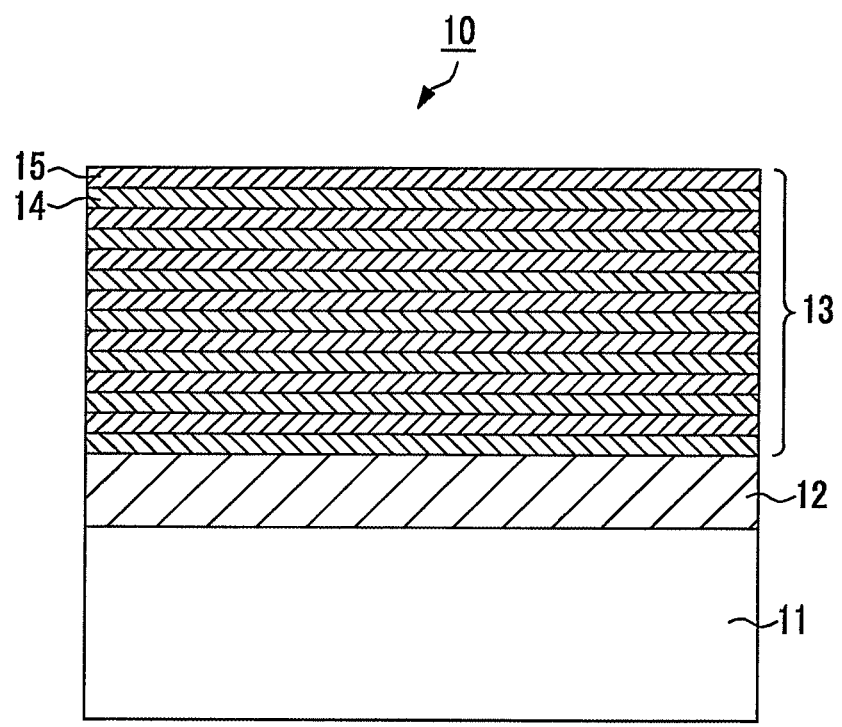

SURFACE-COATING MATERIAL, CUTTING TOOL IN WHICH SAID MATERIAL IS USED, AND WORKING MACHINE IN WHICH SAID MATERIAL IS USED

TECHNICAL FIELD

The present invention relates to a surface-coating material, a cutting tool in which the material is used, and a working machine in which the material is used.

BACKGROUND ART

As a cutting tool with which cutting is performed in a working machine, cutting tools obtained by forming a high-hardness coating film on a surface of a base material using physical vapor deposition represented by ion plating have been developed. Among these cutting tools, the practical use of a cutting tool obtained by forming a layer formed of a metal nitride such as TiN or TiAlN on a surface of a base material has progressed the most.

CITATION LIST

Patent Literature

[PTL 1] Japanese Unexamined Patent Application Publication No. 10-25566
[PTL 2] Japanese Unexamined Patent Application Publication No. 2005-330539
[PTL 3] Japanese Unexamined Patent Application Publication No. 2009-285758
[PTL 4] Japanese Patent No. 3963354

SUMMARY OF INVENTION

Technical Problem

However, when the above-described cutting tool is used in a high-temperature range of higher than 800° C., oxidation of the metal nitride is started, and thus there is a problem in that the cutting tool cannot be used for a long period of time. Therefore, as a cutting tool which can be used in a high-temperature range, cutting tools obtained by providing a surface-coating material such as an AlCrN coating film or an (AlCrM)N coating film (M represents at least one element or two or more elements selected from elements other than Cr in Groups 4a, 5a, and 6a of the periodic table, B, Si, and Y) on a surface of a base material are considered (for example, refer to the above-described PTLs 1 to 4).

However, the cutting tools obtained by providing the surface-coating material on the surface of the base material have a problem in the adhesion of the surface-coating material. In addition, under a cutting condition of high-speed feeding where a high load is locally applied to a cutting blade portion along with a large amount of heat generation; peeling or chipping (small cracking) occurs in the surface-coating material in the early stage. Therefore, there is a problem in that the lifetime ends within a relatively short period of time, and superior wear resistance in a high-temperature range which is a intrinsic characteristic of the surface-coating material cannot be sufficiently exhibited.

The above-described problems may occur in the same way as described above not only in the above-described cutting tools used in a working machine but also in components and dies to which a surface-coating material requiring superior wear resistance in a high-temperature range is applied.

Accordingly, the invention has been made in order to solve the above-described problems, and an object thereof is to provide a surface-coating material capable of exhibiting high peeling resistance and high chipping resistance, a cutting tool in which the material is used, and a working machine in which the material is used.

Solution to Problem

According to a first aspect of the present invention for solving the above-described problems, there is provided a surface-coating material including a top layer on a surface of the surface-coating material, in which in the top layer, one or more A layers, which contain a nitride of aluminum, chromium, and silicon and one or more B layers, which contain a nitride of aluminum, chromium, and yttrium, are alternately laminated, and the top layer is provided on a surface of a metal nitride.

According to a second aspect of the present invention for solving the above-described problems, in the surface-coating material according to the first aspect, the A layer satisfies $0.15 \leq a \leq 0.59$ and $0.01 \leq b \leq 0.1$ by atomic ratio when represented by a compositional formula $(Al_{1-a-b}Cr_aSi_b)N$, and the B layer satisfies $0.15 \leq c \leq 0.60$ and $0.005 \leq d \leq 0.1$ by atomic ratio when represented by a compositional formula $(Al_{1-c-d}Cr_cY_d)N$.

According to a third aspect of the present invention for solving the above-described problems, in the surface-coating material according to the first or second aspect, each of the A layer and the B layer has a thickness of 240 nm or less.

According to a fourth aspect of the present invention for solving the above-described problems, in the surface-coating material according to the first aspect, the B layer further contains a nitride of silicon.

According to a fifth aspect of the present invention for solving the above-described problems, in the surface-coating material according to the fourth aspect, the A layer satisfies $0.15 \leq a \leq 0.60$ and $0.01 \leq b \leq 0.1$ by atomic ratio when represented by a compositional formula $(Al_{1-a-b}Cr_aSi_b)N$, and the B layer satisfies $0.15 \leq c \leq 0.60$, $0.01 \leq d \leq 0.1$, and $0.005 \leq e \leq 0.1$ by atomic ratio when represented by a compositional formula $(Al_{1-c-d-e}Cr_cSi_dY_e)N$.

According to a sixth aspect of the present invention for solving the above-described problems, in the surface-coating material according to the fourth or fifth aspect, each of the A layer and the B layer has a thickness of 150 nm or less.

According to a seventh aspect of the present invention for solving the above-described problems, in the surface-coating material according to any one of the first to sixth aspects, the top layer has a thickness of 2 μm to 8 μm.

According to an eighth aspect of the present invention for solving the above-described problems, in the surface-coating material according to any one of the first to seventh aspects, the metal nitride contains a nitride of at least one element of titanium, aluminum, chromium, and zirconium.

According to a ninth aspect of the present invention for solving the above-described problems, in the surface-coating material according to any one of the first to eighth aspects, the metal nitride is provided on a surface of a base material.

According to a tenth aspect of the present invention for solving the above-described problems, in the surface-coating material according to the ninth aspect, the base material contains high-speed tool steel or cemented carbide.

According to an eleventh aspect of the present invention for solving the above-described problems, there is provided a cutting tool including the surface-coating material according to any one of the first to tenth aspects.

According to a twelfth aspect of the present invention for solving the above-described problems, there is provided a working machine including a cutting tool that includes the surface-coating material according to any one of the first to tenth aspects.

Advantageous Effects of Invention

The surface-coating material according to the present invention can exhibit high peeling resistance and high chipping resistance. Therefore, superior wear resistance in a high-temperature range which is an intrinsic characteristic of the top layer can be sufficiently exhibited.

BRIEF DESCRIPTION OF DRAWINGS

FIG. 1 is a diagram showing a structure of a surface-coating material according to an embodiment of the present invention.

DESCRIPTION OF EMBODIMENTS

Preferred embodiments of a surface-coating material, a cutting tool in which the material is used, and a working machine in which the material is used according to the present invention will be described based on the drawing. However, the present invention is not limited to only the following embodiments described based on the drawing.

An embodiment of the surface-coating material, the cutting tool in which the material is used, and the working machine in which the material is used according to the present invention will be described based on FIG. 1.

As shown in FIG. 1, a surface-coating material 10 according to the embodiment includes a base material 11, a bottom layer 12, and a top layer 13. The base material 11 contains high-speed tool steel or cemented carbide. The bottom layer 12 is provided on a surface of the base material 11 and contains at least one of nitrides (N) of titanium (Ti), aluminum (Al), chromium (Cr), and zirconium (Zr). The top layer 13 is provided on a surface of the bottom layer 12 and is formed by alternately laminating one or more (in the drawing, seven) A layers 14 and one or more (in the drawing, seven) B layers 15. The A layer 14 contains a nitride (N) of aluminum (Al), chromium (Cr), or silicon (Si). The B layer 15 contains a nitride (N) of aluminum (Al), chromium (Cr), or yttrium (Y).

In addition, it is preferable that the B layer 15 further contains a nitride (N) of silicon (Si).

The surface-coating material 10 can be easily manufactured using a method including: providing the bottom layer 12 containing the above-described composition on the base material 11 using physical vapor deposition (PVD) such as sputter deposition or ion plating; and then providing the top layer 13 thereon, in which the top layer 13 is formed by alternately laminating the one or more A layers 14 and the one or more B layers 15.

The surface-coating material 10 has an alternately laminated structure (multilayer structure) of the A layers containing (AlCrSi)N and the B layers 15 containing (AlCrY)N or (AlCrSiY)N. As a result, peeling resistance and chipping resistance of the top layer 13 are improved, and superior wear resistance in a high-temperature range which is an intrinsic characteristic of a hard coating film can be sufficiently exhibited, the hard coating film being a composite nitride containing Al, Cr, Si, and Y as essential components.

Further, the bottom layer 12 contains a nitride (for example, TiN, CrN, ZrN, or TiAlN) of at least one element of titanium (Ti), aluminum (Al), chromium (Cr), and zirconium (Zr). As a result, the adhesion between the bottom layer 12 and the base material 11 (cutting tool surface) can be improved.

Accordingly, in a cutting tool and a working machine in which the surface-coating material 10 according to the embodiment is used, even when a condition of locally applying a high load is used, the peeling and chipping of the top layer 13 can be prevented over a long period of time. Therefore, superior wear resistance in a high-temperature range which is an intrinsic characteristic of the top layer 13 can be sufficiently exhibited.

It is preferable that the B layer 15 satisfies $0.15 \leq c \leq 0.6$ and $0.005 \leq d \leq 0.1$ by atomic ratio when represented by a compositional formula $(Al_{1-c-d}Cr_cY_d)N$. The reason is as follows. It is not preferable that the composition ratio of c is lower than 0.15 because, as the element ratio of aluminum (Al) is increased, particularly, higher than 0.75, the hardness of the B layer 15 is likely to be decreased. It is not preferable that the composition ratio of c is higher than 0.6 because, as the element ratio of chromium (Cr) is increased, the hardness of the B layer 15 is likely to be decreased. It is not preferable that the composition ratio of d is lower than 0.005 because it is difficult to obtain the effect of improving heat resistance by the addition of yttrium (Y). It is not preferable that the composition ratio of d is higher than 0.1 because it is difficult to manufacture the B layer 15.

When the B layer 15 can be represented by a composition formula $(Al_{1-c-d}Cr_cY_d)N$ (wherein $0.15 \leq c \leq 0.6$ and $0.005 \leq d \leq 0.1$ are satisfied by atomic ratio), it is preferable that the A layer 14 satisfies $0.15 \leq a \leq 0.59$ and $0.01 \leq b \leq 0.1$ by atomic ratio when represented by a compositional formula $(Al_{1-a-b}Cr_aSi_b)N$. The reason is as follows. It is not preferable that the composition ratio of a is lower than 0.15 because, as the element ratio of aluminum (Al) is increased, particularly, higher than 0.75, the hardness of the A layer 14 is likely to be decreased. It is not preferable that the composition ratio of a is higher than 0.59 because, as the element ratio of chromium (Cr) is increased, the hardness of the A layer 14 is likely to be decreased. It is not preferable that the composition ratio of b is lower than 0.01 because it is difficult to obtain the effect of improving heat resistance by the addition of silicon (Si). It is not preferable that the composition ratio of b is higher than 0.1 because it is difficult to manufacture the A layer 14.

It is preferable that the B layer 15 satisfies $0.15 \leq c \leq 0.60$, $0.01 \leq d \leq 0.1$, and $0.005 \leq e \leq 0.1$ by atomic ratio when represented by a compositional formula $(Al_{1-c-d-e}Cr_cSi_dY_e)N$. The reason is as follows. It is not preferable that the composition ratio of c is lower than 0.15 because, as the element ratio of aluminum (Al) is increased, particularly, higher than 0.75, the hardness of the B layer 15 is likely to be decreased. It is not preferable that the composition ratio of c is higher than 0.60 because, as the element ratio of chromium (Cr) is increased, the hardness of the B layer 15 is likely to be decreased. It is not preferable that the composition ratio of d is lower than 0.01 because it is difficult to obtain the effect of improving heat resistance by the addition of silicon (Si). It is not preferable that the composition ratio of d is higher than 0.1 because it is difficult to manufacture the B layer 15 due to unstable target discharge during deposition. It is not preferable that the composition ratio of e is lower than 0.005 because it is difficult to obtain the effect of improving wear resistance by the addition of yttrium (Y). It is not preferable that the composition ratio of e is higher than 0.1 because it is difficult to manufacture the B layer 15 due to unstable target discharge during deposition.

When the B layer 15 can be represented by a composition formula $(Al_{1-c-d-e}Cr_cSi_dY_e)N$ (wherein $0.15 \leq c \leq 0.60$, $0.01 \leq d \leq 0.1$, and $0.005 \leq e \leq 0.1$ are satisfied by atomic ratio), it is preferable that the A layer 14 satisfies $0.15 \leq a \leq 0.60$ and $0.015 \leq b \leq 0.1$ by atomic ratio when represented by a compositional formula $(Al_{1-a-b}Cr_aSi_b)N$. The reason is as follows. It is not preferable that the composition ratio of a is lower than 0.15 because, as the element ratio of aluminum (Al) is increased, particularly, higher than 0.75, the hardness of the A layer 14 is likely to be decreased. It is not preferable that the composition ratio of a is higher than 0.60 because, as the element ratio of chromium (Cr) is increased, the hardness of the A layer 14 is likely to be decreased. It is not preferable that the composition ratio of b is lower than 0.01 because it is difficult to obtain the effect of improving heat resistance by the addition of silicon (Si). It is not preferable that the composition ratio of b is higher than 0.1 because it is difficult to manufacture the A layer 14.

When the A layer 14 contains (AlCrSi)N, and when the B layer contains (AlCrY)N, it is preferable that each of the A layer 14 and the B layer 15 has a thickness of 240 nm or less (particularly 200 nm or less). The reason is as follows. It is not preferable that the thickness of each of the A layer 14 and the B layer 15 is more than 240 nm because plastic deformability in the A layer 14 (single layer) and the B layer 15 (single layer) is decreased, and peeling resistance and chipping resistance obtained by the alternately laminated structure are likely to be decreased.

When the A layer 14 contains (AlCrSi)N, and when the B layer 15 contains (AlCrSiY)N, it is preferable that each of the A layer 14 and the B layer 15 has a thickness of 150 nm or less (particularly 100 nm or less). The reason is as follows. It is not preferable that the thickness of each of the A layer 14 and the B layer 15 is more than 150 nm because plastic deformability in the A layer 14 (single layer) and the B layer 15 (single layer) is decreased, and peeling resistance and chipping resistance obtained by the alternately laminated structure are likely to be decreased.

It is preferable that the A layer 14 and the B layer 15 have the same thickness. The reason is as follows. It is not preferable that the A layer 14 and the B layer 15 have different thicknesses because peeling properties between the A layer 14 and the B layer 15 are likely to be increased.

It is preferable that the top layer 13 has a thickness of 2 μm to 8 μm (particularly, 3 μm to 6 μm). The reason is as follows. It is not preferable that the thickness of the top layer 13 is more than 8 μm because, under a cutting condition of high-speed feeding, particularly, in interrupted cutting, peeling and chipping are likely to occur in a cutting blade portion, and the lifetime ends within a relatively short period of time. It is not preferable that the thickness of the top layer 13 is less than 2 μm because the wear resistance of the top layer cannot be sufficiently exhibited, and thus it is difficult to secure cutting performance over a long period of time.

It is preferable that the base material 11 contains high-speed tool steel or cemented carbide. The reason is as follows. By the base material 11 containing high-speed tool steel or cemented carbide, under a cutting condition of high-speed feeding, particularly, in interrupted cutting, superior wear resistance can be exhibited without peeling and chipping in the bottom layer 12, and thus stable cutting performance can be exhibited over a long period of time.

In addition, the cutting tool is not particularly limited as long as it is a tool for performing cutting, but is particularly preferably a gear cutting tool such as a hob cutter or a pinion cutter, or a broach cutter. The working machine is not particularly limited as long as it can perform cutting, but is particularly preferably a gear cutting machine such as a bobbing machine or a gear shaping machine, or a broaching machine.

Another Embodiment

In the above description of the embodiment, the base material 11 containing high-speed tool steel or cemented carbide is applied to the surface-coating material 10. However, a base material containing another metal material (for example, various special steels and alloy steels) can be applied to the surface-coating material 10.

In the above description of the embodiment, the surface-coating material 10 includes the top layer 13 obtained by alternately laminating the one or more A layers 14 and the one or more B layers 15, in which the B layer 15 is provided on the surface of the A layer 14. However, the surface-coating material 10 may include the top layer 13 obtained by alternately laminating the one or more A layers 14 and the one or more B layers 15, in which the A layer 14 is provided on the surface of the B layer 15.

EXAMPLES

Hereinafter, examples will be described which were performed to verify the effects of the surface-coating material, the cutting tool in which the material is used, and the working machine in which the material is used according to the present invention. However, the present invention is not limited to only the following examples described below based on various data.

[Verification Test 1]

In this test, test samples, comparative samples, and reference samples were prepared by providing surface-coating materials shown in Table 1 below on a surface of a formed fly tool (cutting tool) including high-speed tool steel SKH 55 as a base material using an arc ion plating apparatus. Regarding the test samples, the comparative samples, and the reference samples, a cutting test was performed under the following cutting conditions to measure the width of flank wear of the tool.

<Cutting Conditions>

Work material: SCM 415

Cutting method: interrupted cutting

Cutting speed: 200 m/min

Feed rate: 1.2 mm/blade

Depth of cut: 1 mm

Cutting fluid: air blow

Length of cut: 1 m

TABLE 1

| | | Bottom Layer | | Top Layer | | | |
| --- | --- | --- | --- | --- | --- | --- | --- |
| | | Composition | Thickness (μm) | A Layer Composition | B Layer Composition | Total Number of Layers Laminated (A Layers + B Layers) | Total Thickness of Layers (μm) |
| Test Samples | a1 | CrN | 0.5 | $(Al_{0.5}Cr_{0.45}Si_{0.05})N$ | $(Al_{0.72}Cr_{0.275}Y_{0.005})N$ | 60 | 3.4 |
| | a2 | CrN | 1.2 | $(Al_{0.4}Cr_{0.59}Si_{0.01})N$ | $(Al_{0.75}Cr_{0.15}Y_{0.1})N$ | 20 | 4.8 |
| | a3 | CrN | 2 | $(Al_{0.61}Cr_{0.37}Si_{0.02})N$ | $(Al_{0.5}Cr_{0.46}Y_{0.04})N$ | 140 | 4.1 |
| | a4 | CrN | 1 | $(Al_{0.75}Cr_{0.15}Si_{0.1})N$ | $(Al_{0.39}Cr_{0.6}Y_{0.01})N$ | 40 | 3.5 |
| | a5 | TiN | 0.8 | $(Al_{0.5}Cr_{0.45}Si_{0.05})N$ | $(Al_{0.75}Cr_{0.15}Y_{0.1})N$ | 30 | 3.8 |
| | a6 | TiN | 2.1 | $(Al_{0.4}Cr_{0.59}Si_{0.01})N$ | $(Al_{0.5}Cr_{0.46}Y_{0.04})N$ | 80 | 3.1 |
| | a7 | TiN | 1.5 | $(Al_{0.61}Cr_{0.37}Si_{0.02})N$ | $(Al_{0.39}Cr_{0.6}Y_{0.01})N$ | 50 | 2.8 |
| | a8 | ZrN | 0.7 | $(Al_{0.5}Cr_{0.45}Si_{0.05})N$ | $(Al_{0.39}Cr_{0.6}Y_{0.01})N$ | 100 | 4 |
| | a9 | ZrN | 1.3 | $(Al_{0.61}Cr_{0.37}Si_{0.02})N$ | $(Al_{0.75}Cr_{0.15}Y_{0.1})N$ | 60 | 3.6 |
| | a10 | TiAlN | 0.7 | $(Al_{0.5}Cr_{0.45}Si_{0.05})N$ | $(Al_{0.39}Cr_{0.6}Y_{0.01})N$ | 100 | 4.1 |
| | a11 | TiAlN | 1.5 | $(Al_{0.61}Cr_{0.37}Si_{0.02})N$ | $(Al_{0.75}Cr_{0.15}Y_{0.1})N$ | 60 | 3.7 |
| Comparative Samples | a1 | CrN | 1.1 | $(Al_{0.75}Cr_{0.15}Si_{0.1})N$ | — | 1 | 2.9 |
| | a2 | CrN | 1 | — | $(Al_{0.5}Cr_{0.46}Y_{0.04})N$ | 1 | 3.1 |
| | a3 | — | — | $(Al_{0.75}Cr_{0.15}Si_{0.1})N$ | $(Al_{0.39}Cr_{0.6}Y_{0.01})N$ | 40 | 3.5 |
| Reference Examples | a1 | TiN | 1.1 | $(Al_{0.5}Cr_{0.5})N$ | — | 1 | 3.1 |
| | a2 | TiAlN | 1.5 | $(Al_{0.50}Cr_{0.45}Si_{0.05})N$ | — | 1 | 3.3 |

TABLE 2

| Test Examples | a1 | a2 | a3 | a4 | a5 | a6 | a7 | a8 | a9 | a10 | a11 |
| --- | --- | --- | --- | --- | --- | --- | --- | --- | --- | --- | --- |
| Width of Flank Wear (mm) | 0.1 | 0.14 | 0.08 | 0.13 | 0.15 | 0.1 | 0.12 | 0.11 | 0.13 | 0.16 | 0.14 |

TABLE 3

| | Comparative Samples | | | Reference Samples | |
| --- | --- | --- | --- | --- | --- |
| | a1 | a2 | a3 | a1 | a2 |
| Width of Flank Wear (mm) | 0.24 | 0.26 | 0.35 | 0.3 | 0.25 |

As shown in Tables 2 and 3, it was verified that the peeling resistance and chipping resistance of the base material 11 or the top layer 13 can be improved by using the surface-coating material obtained by providing the top layer on the surface of the metal nitride, in which the top layer is formed by alternately laminating one or more A layers containing a nitride (N) of aluminum (Al), chromium (Cr), and silicon (Si) and one or more B layers containing a nitride (N) of aluminum (Al), chromium (Cr), and yttrium (Y). As a result, superior wear resistance in a high-temperature range which is an intrinsic characteristic of the top layer 13 can be sufficiently exhibited, the top layer 13 being a composite nitride containing aluminum (Al), chromium (Cr), silicon (Si), and yttrium (Y) as major components.

[Verification Test 2]

In this test, test samples, comparative samples, and reference samples were prepared by providing surface-coating materials shown in Table 4 below on a surface of a formed fly tool (cutting tool) including high-speed tool steel SKH 55 as a base material using an arc ion plating apparatus. Regarding the test samples, the comparative samples, and the reference samples, a cutting test was performed under the same cutting conditions as those of the above verification test 1 to measure the width of flank wear of the tool.

TABLE 4

| | | Bottom Layer | | Top Layer | | | |
| --- | --- | --- | --- | --- | --- | --- | --- |
| | | Composition | Thickness (μm) | A Layer Composition | B Layer Composition | Total Number of Layers Laminated (A Layers + B Layers) | Total Thickness of Layers (μm) |
| Test Samples | b1 | CrN | 0.8 | $(Al_{0.5}Cr_{0.45}Si_{0.05})N$ | $(Al_{0.60}Cr_{0.385}Si_{0.01}Y_{0.005})N$ | 60 | 3.4 |
| | b2 | CrN | 1.2 | $(Al_{0.4}Cr_{0.59}Si_{0.01})N$ | $(Al_{0.70}Cr_{0.15}Si_{0.05}Y_{0.1})N$ | 30 | 4.5 |
| | b3 | CrN | 1.9 | $(Al_{0.61}Cr_{0.37}Si_{0.02})N$ | $(Al_{0.5}Cr_{0.36}Si_{0.1}Y_{0.04})N$ | 140 | 4.3 |
| | b4 | CrN | 1 | $(Al_{0.75}Cr_{0.15}Si_{0.1})N$ | $(Al_{0.34}Cr_{0.60}Si_{0.05}Y_{0.01})N$ | 40 | 3.5 |
| | b5 | TiN | 0.8 | $(Al_{0.5}Cr_{0.45}Si_{0.05})N$ | $(Al_{0.70}Cr_{0.15}Si_{0.1}Y_{0.1})N$ | 40 | 3.6 |
| | b6 | TiN | 2 | $(Al_{0.39}Cr_{0.60}Si_{0.01})N$ | $(Al_{0.5}Cr_{0.36}Si_{0.1}Y_{0.04})N$ | 80 | 2.9 |
| | b7 | TiN | 1.3 | $(Al_{0.61}Cr_{0.37}Si_{0.02})N$ | $(Al_{0.34}Cr_{0.60}Si_{0.05}Y_{0.01})N$ | 50 | 2.8 |
| | b8 | ZrN | 0.8 | $(Al_{0.5}Cr_{0.45}Si_{0.05})N$ | $(Al_{0.34}Cr_{0.60}Si_{0.05}Y_{0.01})N$ | 100 | 3.9 |
| | b9 | ZrN | 1.1 | $(Al_{0.61}Cr_{0.37}Si_{0.02})N$ | $(Al_{0.70}Cr_{0.15}Si_{0.05}Y_{0.1})N$ | 60 | 3.6 |
| | b10 | TiAlN | 0.7 | $(Al_{0.5}Cr_{0.45}Si_{0.05})N$ | $(Al_{0.34}Cr_{0.60}Si_{0.05}Y_{0.01})N$ | 100 | 4 |
| | b11 | TiAlN | 1.4 | $(Al_{0.61}Cr_{0.37}Si_{0.02})N$ | $(Al_{0.70}Cr_{0.15}Si_{0.05}Y_{0.1})N$ | 60 | 3.6 |
| Comparative Samples | b1 | CrN | 1.1 | $(Al_{0.75}Cr_{0.15}Si_{0.1})N$ | — | 1 | 2.9 |
| | b2 | CrN | 1.2 | — | $(Al_{0.5}Cr_{0.36}Si_{0.1}Y_{0.04})N$ | 1 | 2.7 |
| | b3 | — | — | $(Al_{0.75}Cr_{0.15}Si_{0.1})N$ | $(Al_{0.34}Cr_{0.60}Si_{0.05}Y_{0.01})N$ | 40 | 3.4 |

TABLE 4-continued

| | | Bottom Layer | | Top Layer | | | |
|---|---|---|---|---|---|---|---|
| | | Composition | Thickness (μm) | A Layer Composition | B Layer Composition | Total Number of Layers Laminated (A Layers + B Layers) | Total Thickness of Layers (μm) |
| Reference Examples | b1 | TiN | 1.1 | $(Al_{0.5}Cr_{0.5})N$ | — | 1 | 3.1 |
| | b2 | TiAlN | 1.5 | $(Al_{0.50}Cr_{0.45}Si_{0.05})N$ | — | 1 | 3.3 |

TABLE 5

| Test Examples | b1 | b2 | b3 | b4 | b5 | b6 | b7 | b8 | b9 | b10 | b11 |
|---|---|---|---|---|---|---|---|---|---|---|---|
| Width of Flank Wear (mm) | 0.12 | 0.16 | 0.11 | 0.12 | 0.16 | 0.11 | 0.12 | 0.12 | 0.13 | 0.16 | 0.15 |

TABLE 6

| | Comparative Samples | | | Reference Samples | |
|---|---|---|---|---|---|
| | b1 | b2 | b3 | b1 | b2 |
| Width of Flank Wear (mm) | 0.24 | 0.31 | 0.39 | 0.3 | 0.25 |

As shown in Tables 5 and 6, it was verified that the peeling resistance and chipping resistance of the base material 11 or the top layer 13 can be improved by using the surface-coating material obtained by providing the top layer on the surface of the metal nitride, in which the top layer is formed by alternately laminating one or more A layers containing a nitride (N) of aluminum (Al), chromium (Cr), and silicon (Si) and one or more B layers containing a nitride (N) of aluminum (Al), chromium (Cr), silicon (Si) and yttrium (Y). As a result, superior wear resistance in a high-temperature range which is an intrinsic characteristic of the top layer 13 can be sufficiently exhibited, the top layer 13 being a composite nitride containing aluminum (Al), chromium (Cr), silicon (Si), and yttrium (Y) as major components.

INDUSTRIAL APPLICABILITY

The surface-coating material, the cutting tool in which the material is used, and the working machine in which the material is used according to the present invention can exhibit high peeling resistance and high chipping resistance. Therefore, superior wear resistance in a high-temperature range which is an intrinsic characteristic of the top layer can be sufficiently exhibited. Accordingly, the present invention has extremely high industrial applicability.

REFERENCE SIGNS LIST

10: SURFACE-COATING MATERIAL
11: BASE MATERIAL
12: BOTTOM LAYER
13: TOP LAYER
14: A LAYER
15: B LAYER

The invention claimed is:

1. A surface-coating material including a top layer on a surface of the surface-coating material,
   wherein in the top layer, one or more A layers, which contain a nitride of aluminum, chromium, and silicon and one or more B layers, which contain a nitride of aluminum, chromium, silicon and yttrium, are alternately laminated, and
   the top layer is provided on a surface of a metal nitride;
   wherein each of the A layer and the B layer has a thickness of 150 nm or less.

2. The surface-coating material according to claim 1,
   wherein the A layer satisfies $0.15 \leq a \leq 0.60$ and $0.01 \leq b \leq 0.1$ by atomic ratio when represented by a compositional formula $(Al_{1-a-b}Cr_aSi_b)N$, and
   the B layer satisfies $0.15 \leq c \leq 0.60$, $0.01 \leq d \leq 0.1$, and $0.005 \leq e \leq 0.1$ by atomic ratio when represented by a compositional formula $(Al_{1-c-d-e}Cr_cSi_dY_e)N$.

3. The surface-coating material according to claim 1,
   wherein the top layer has a thickness of 2 μm to 8 μm.

4. The surface-coating material according to claim 1,
   wherein the metal nitride contains a nitride of at least one element of titanium, aluminum, chromium, and zirconium.

5. The surface-coating material according to claim 1,
   wherein the metal nitride is provided on a surface of a base material.

6. The surface-coating material according to claim 5,
   wherein the base material contains high-speed tool steel or cemented carbide.

7. A cutting tool comprising the surface-coating material according to claim 1.

8. A working machine comprising a cutting tool that includes the surface-coating material according to claim 1.

* * * * *